(12) United States Patent
Martin et al.

(10) Patent No.: US 9,806,206 B2
(45) Date of Patent: Oct. 31, 2017

(54) OPTIMIZED GRID DESIGN FOR CONCENTRATOR SOLAR CELL

(71) Applicants: International Business Machines Corporation, Armonk, NY (US); King Abdulaziz City for Science and Technology, Riyadh (SA)

(72) Inventors: Yves C. Martin, Ossining, NY (US); Abdelmajid Salhi, Riyadh (SA); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/698,472

(22) Filed: Apr. 28, 2015

(65) Prior Publication Data

US 2016/0322513 A1    Nov. 3, 2016

(51) Int. Cl.
  *H01L 31/0224*    (2006.01)
  *H01L 31/02*      (2006.01)

(52) U.S. Cl.
  CPC .............................. *H01L 31/0201* (2013.01)

(58) Field of Classification Search
  CPC ............................................... H01L 31/022433
  See application file for complete search history.

(56) References Cited

U.S. PATENT DOCUMENTS

| | | | | |
|---|---|---|---|---|
| 4,171,989 A | * | 10/1979 | Pryor | ............... H01L 31/022433 |
| | | | | 136/256 |
| 4,228,315 A | * | 10/1980 | Napoli | ............ H01L 31/022433 |
| | | | | 136/256 |
| 6,573,445 B1 | | 6/2003 | Burgers | |
| 7,495,167 B2 | * | 2/2009 | Joge | ................... H01L 31/03529 |
| | | | | 136/243 |
| 7,719,746 B2 | | 5/2010 | Goetz et al. | |
| 8,481,844 B2 | | 7/2013 | Nishida et al. | |
| 2005/0172996 A1 | | 8/2005 | Hacke et al. | |
| 2011/0168255 A1 | * | 7/2011 | Wu | ................. H01L 31/022425 |
| | | | | 136/256 |
| 2011/0247688 A1 | | 10/2011 | Yoon et al. | |

(Continued)

FOREIGN PATENT DOCUMENTS

JP    2005353904 A    12/2005

OTHER PUBLICATIONS

Quadratic Functions—Evidentiary Reference.*

(Continued)

*Primary Examiner* — Magali P Slawski
(74) *Attorney, Agent, or Firm* — Vazken Alexanian; Michael J. Chang, LLC

(57) ABSTRACT

Grid patterns for concentrator solar cells that increase power output are provided. In one aspect, a top contact for a solar cell is provided that includes: bus connectors and metallic fingers attached to the bus connectors, wherein each of the metallic fingers has a base which is connected to one of the bus connectors or to another one of the metallic fingers such that each of the metallic fingers is attached to one of the bus connectors either directly or indirectly via another one of the metallic fingers, and wherein at least one of the metallic fingers has a width that is tapered quadratically along a length of the metallic finger. A solar cell and a method of forming a solar cell top contact are also provided.

12 Claims, 7 Drawing Sheets

(56) References Cited

U.S. PATENT DOCUMENTS

| | | | |
|---|---|---|---|
| 2011/0277835 A1* | 11/2011 | Masson | H01L 31/022433 136/256 |
| 2013/0000705 A1* | 1/2013 | Shappir | H01L 31/022425 136/255 |
| 2013/0306128 A1* | 11/2013 | Kannou | H01L 31/022433 136/244 |
| 2014/0069501 A1 | 3/2014 | Alabduljabbar et al. | |
| 2014/0090685 A1* | 4/2014 | Magalhaes Mendes | H01L 51/445 136/244 |
| 2014/0166102 A1 | 6/2014 | Bende | |

OTHER PUBLICATIONS

Lammert et al. "The Interdigitated Back Contact Solar Cell: Silicon Solar Cell for Use in Concentrated Sunlight" IEEE Transactions on Electron Devices, vol. ED-24, No. 4, Apr. 1977.*

R.S. Scharlack, "The optimal design of solar cell grid lines," Solar Energy, vol. 23, No. 3, Jun. 1979, pp. 199-201.

P. Verlinden et al., "Multilevel metallization for large area point-contact solar cells," Twentieth IEEE Photovoltaic Specialists Conference, Sep. 1988, pp. 532-537.

A.R. Burgers, "How to Design Optimal Metallization Patterns for Solar Cells," Progress in Photovoltaics Research and Applications, vol. 7, No. 6, Nov./Dec. 1999, pp. 457-461.

Wen et al., "Optimization of grid design for solar cells," Journal of Semiconductors, vol. 31, No. 1 (Jan. 2010).

English translation of Japanese Patent JP2005353904 A by Nunoi et al.; Sharp KK (dated Nov. 3, 2014).

\* cited by examiner

FIGS. 7A-D

OPTIMIZED GRID DESIGN FOR CONCENTRATOR SOLAR CELL

FIELD OF THE INVENTION

The present invention relates to concentrator solar cells and more particularly, to grid pattern designs for concentrator solar cells that increase power output.

BACKGROUND OF THE INVENTION

Photovoltaic solar cells often include a top contact which consists of a metal grid on top of the light absorbing layers of the device. The design of the grid is such that it must be sufficiently electrically conductive yet permit enough light to pass to the underlying cell. These requirements for conductivity and transparency are often at odds with one another. For instance, a thicker grid design leads to better conductivity but reduced transparency, and vice versa.

At high solar concentrations, the design of a photovoltaic solar cell grid is important for maximum energy conversion efficiency. The current density is very high and appreciable power can be lost in the grid resistance. Conventional grid designs often include a simple symmetrical pattern consisting of a plurality of metallic fingers connected to a common bus which is usually a larger metallic contact at the sides of the cell. For instance, a common linear grid design is to have two parallel bus connectors on opposite sides of the cell and thinner metallic fingers interconnecting the bus connectors in a ladder-like configuration. Another commonly employed design is an inverted square symmetry grid configuration. See, for example, Wen et al., "Optimization of grid design for solar cells," Journal of Semiconductors, vol. 31, no. 1 (January 2010) (hereinafter "Wen") (FIG. 1a shows a linear grid design and FIG. 1b shows an inverted square symmetry grid configuration).

The charge carriers generated in a solar cell must travel along the metallic fingers of the top grid until they reach the common bus. The further the carriers travel along the grid to reach the bus, the greater the resistive power loss is. With conventional grid designs the loss due to resistance is still undesirably high.

Thus, concentrator solar cell top contact grid designs that maximize both conductivity and transparency would be desirable.

SUMMARY OF THE INVENTION

The present invention provides grid pattern designs for concentrator solar cells that increase power output. In one aspect of the invention, a top contact for a solar cell is provided. The top contact includes: bus connectors; and metallic fingers attached to the bus connectors, wherein each of the metallic fingers has a base which is connected to one of the bus connectors or to another one of the metallic fingers such that each of the metallic fingers is attached to one of the bus connectors either directly or indirectly via another one of the metallic fingers, and wherein at least one of the metallic fingers has a width that is tapered quadratically along a length of the metallic finger.

In another aspect of the invention, a solar cell is provided. The solar cell includes: a top contact having bus connectors, and metallic fingers attached to the bus connectors, wherein each of the metallic fingers has a base which is connected to one of the bus connectors or to another one of the metallic fingers such that each of the metallic fingers is attached to one of the bus connectors either directly or indirectly via another one of the metallic fingers, and wherein at least one of the metallic fingers has a width that is tapered quadratically along a length of the metallic finger; a bottom contact; and an optically active material having one or more semiconductors disposed between the top contact and the bottom contact.

In yet another aspect of the invention, a method of forming a top contact for a solar cell is provided. The method includes the steps of: forming a base layer on a surface of the solar cell onto which the contact is to be formed; forming a photoresist mask on the base layer wherein the photoresist mask is patterned with a design of the top contact; and electroplating one or more contact metals on exposed portions of the base layer to form the top contact on the surface of the solar cell, the top contact having bus connectors and metallic fingers wherein the metallic fingers are attached to the bus connectors and wherein each of the metallic fingers has a base which is connected to one of the bus connectors or to another one of the metallic fingers such that each of the metallic fingers is attached to one of the bus connectors either directly or indirectly via another one of the metallic fingers, and wherein at least one of the metallic fingers has a width that is tapered quadratically along a length of the metallic finger.

A more complete understanding of the present invention, as well as further features and advantages of the present invention, will be obtained by reference to the following detailed description and drawings.

DETAILED DESCRIPTION OF PREFERRED EMBODIMENTS

Provided herein are concentrator solar cell top contact grid pattern designs which provide increased power output compared to conventional grid patterns for a given cell size, while maximizing transparency. With regard to transparency, as highlighted above the top contact generally consists of a metal grid on top of the light absorbing layers of the device. The metal grid shadows/blocks a portion of the top surface of the device, and thus cuts down the amount of photons received by the semiconductor layers below the grid due to shadowing. The transparency of the device is thus a factor of how much of the top surface is blocked by the metal grid. With regard to transparency, the thinner the grid design the better. However, sufficient electrical conductivity favors a thicker grid design. When the metal grid design is too thin, the losses due to resistance are unacceptably large.

Advantageously, the present techniques optimize the shape of the metal lines of the grid design so that the lines are relatively thicker where they need to carry more current (e.g., at the edges of the cell), and relatively thinner where less current is present (e.g., in the middle of the cell). Specifically, it has been found herein that there is a cumulative effect of current to the edges of the cell (thus requiring larger lines) and in the middle of the cell there is very little current being carried (thus requiring smaller lines).

According to the present techniques, an adaptive width or layout of the top contact grid fingers is employed that contrasts to the uniform width in former grid designs. For the same amount of shadowing that the grid fingers provide, the amount of resistive loss is reduced by a factor on the order of 25% with the present grid design.

Figure 1:
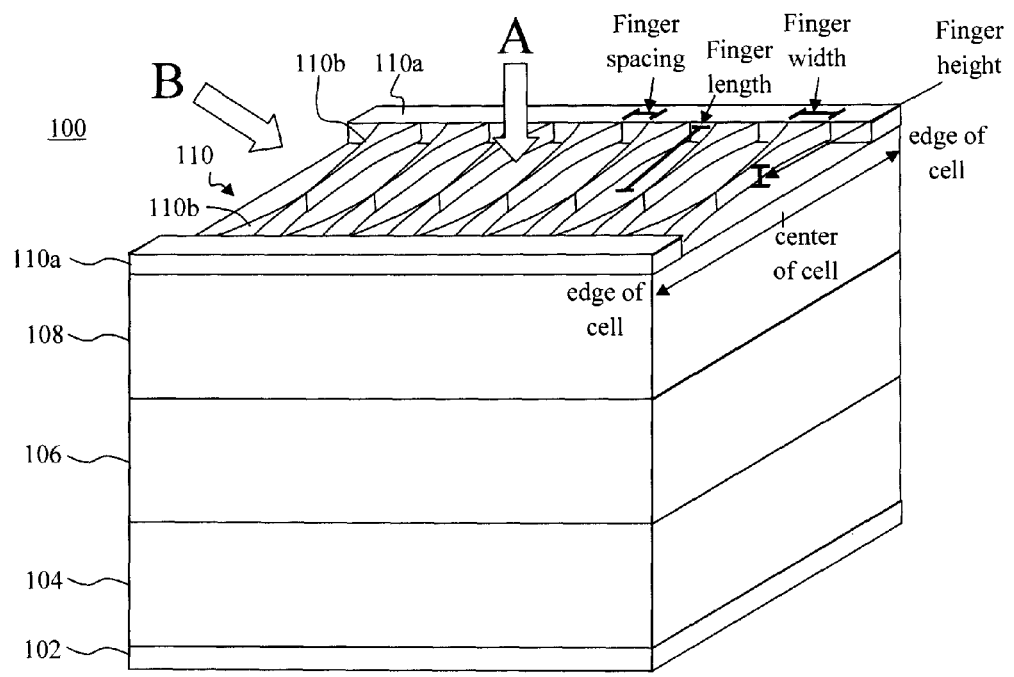
FIG. 1 is a three-dimensional diagram illustrating an exemplary solar cell having an optically active material containing one or more semiconductors sandwiched between two electrodes—i.e., a bottom contact and a top contact having an optimized grid design according to an embodiment of the present invention.

For illustrative purposes, FIG. 1 is provided which depicts an exemplary solar cell having one of the present adaptive grid designs. It is notable that there are a variety of different solar cell designs, including those optimized for high light concentration. Thus, FIG. 1 is not intended to limit the present techniques to any solar cell design in particular, but is being presented merely to illustrate the location of the present top contact grids relative to the solar cell and to further illustrate the orientation of the bus connectors and metallic fingers of the present top contact grids relative to the center and sides of the solar cell.

The solar cells described herein generally include an optically active material containing one or more semiconductors sandwiched between two electrodes. By way of example only, the exemplary solar cell 100 depicted in FIG. 1 is a multi-junction solar cell that includes solar cells 104, 106, and 108. Solar cell 104 may be separated from solar cell 106 by a tunnel diode (not shown). Similarly, solar cell 106 may be separated from solar cell 108 by a tunnel diode (not shown). By way of example only, solar cell 104 can include germanium (Ge), solar cell 106 can include gallium arsenide (GaAs), and solar cell 108 can include gallium indium phosphide (GaInP). This is however only one possible example of the component solar cell configurations. Multi-junction solar cells are well-known in the art and thus are not described further herein. Alternatively, other solar cell designs known in the art include, but are not limited to, single semiconductor photovoltaic cells wherein the charge separating field is generated through doping.

As shown in FIG. 1, solar cell 100 includes two electrodes—i.e., a bottom contact 102 (i.e., below solar cell 104) and a top contact 110 (i.e., on top of solar cell 108). During operation, solar cell 100 acts as an electrical generator for which the bottom contact 102 and the top contact 110 form the two electrical terminals or wires which collect the electric current generated by the solar cell. The bottom contact 102 is preferably a thin metallic film (such as aluminum) in contact with the optically active material. The top contact 110 is also a metallic film in contact with the optically active material. Because it is a metallic conductor, the top contact 110 shadows the light and prevents it from reaching the optically active material below it. To minimize this obstruction, the top contact 110 is shaped as a grid that lets preferably from about 90 percent (%) to about 99% of the light go through.

Concentrated Photovoltaic (CPV) systems use lenses and/or mirrors to focus sunlight onto the solar cells. See, for example, U.S. Patent Application Publication Number 2014/0069501 by Alabduljabbar et al., entitled "Cooling System for High Performance Solar Concentrators" (hereinafter "U.S. Patent Application Publication Number 2014/0069501"), the contents of which are incorporated by reference as if fully set forth herein, which describes and depicts a concentrating solar collector that has a collector optic (such as a lens) and an enclosure support. A two-axis drive system is also described in U.S. Patent Application Publication Number 2014/0069501 which permits the photovoltaic system to follow movement of the sun.

Solar cells designed for CPV systems carry large currents on the order of several Amperes. In order to carry these large currents without resistive loss, the electrodes need to be thicker, and the top contact grid tends to obstruct more light than for a simple solar cell. Thus, according to the present techniques, the following parameters for optimization of the top contact grid design are taken into account. First, it is desirable to minimize electrical resistive loss which, as highlighted above, involves increasing the width and height of the top contact grid fingers and reducing the finger spacing. See FIG. 1. Second, contrary to the first point, in order to minimize shadowing the width of the top contact grid fingers needs to be reduced and the finger spacing increased. Third, the grid design employed should preferably maximize manufacturability robustness, which implies constraints on the aspect ratio of the grid fingers (minimum width for a given height) for reliable fabrication of the grid fingers.

As highlighted above, existing solar cell top contact grid geometries include the linear design (straight simple line grid) and the inverted square design. See, for example, FIG. 1a and FIG. 1b of Wen, the contents of which are incorporated by reference as if fully set forth herein. The linear design, for instance, includes two parallel bus connectors on opposite sides of the solar cell and thinner metallic fingers interconnecting the bus connectors in a ladder-like configuration. The inverted square design includes a bus connector on all four sides of the solar cell and the metallic fingers oriented as thinner nested inverted corner squares interconnecting the bus connectors on perpendicular sides of the solar cell. For CPV applications, the inverted square design is better optimized than the linear design especially at high concentrations of light. Namely, for the inverted square design the average current path from the optically active material to the side bus connectors is minimized, and the overall resistive loss is about half of the loss for the linear design. In both geometries, the width of each metallic finger is kept constant over the full length of the finger.

Electrical resistive loss occurs wherever the current (I) finds a resistive path. Several resistive paths exist in a solar cell, including the sheet resistance in the semiconductor under the grid, the contact resistance where semiconductor and the metal grid meet, the resistance of the grid itself, and the bus resistance where grid fingers are joined at the edge of the cell. A primary focus of the present techniques is in reducing the top contact grid resistance (R). The top contact grid resistance contributes a major portion to the overall resistance in a solar cell.

Figure 2:
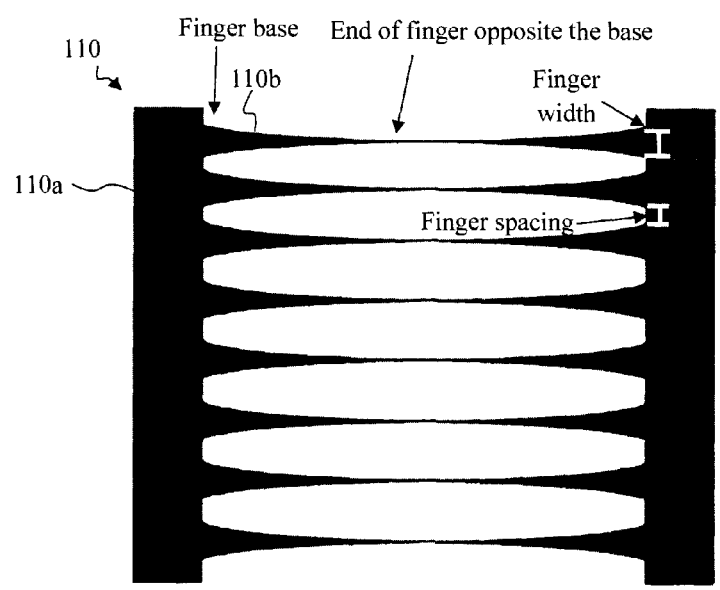
FIG. 2 is a top-down diagram illustrating an exemplary configuration of the top contact having an optimized grid design with parabolic-shaped metallic fingers according to an embodiment of the present invention.

According to an exemplary embodiment, the present techniques involve changing the shape of the top contact grid fingers in a way that increases the electrical conductivity of the fingers with a distance from the center of the solar cell. Namely, the photo-generated electrical current from the solar cell accumulates as it is conducted by the top contact grid from areas near the center of the solar cell to the regions at the edges of the solar cell, where it is collected by the wider metallic bus regions. In a first embodiment, the top contact grid fingers have a tapered design. A first exemplary tapered finger design is depicted in FIG. 1 and FIG. 2, wherein the width of each of the fingers decreases quadratically with the finger length (labeled "Finger length"—see FIG. 1). In the example shown in FIG. 1, the top contact 110 has two parallel bus connectors 110a on opposite edges of the solar cell, and metallic fingers 110b in between and connected to the bus connectors 110a. The metallic fingers 110b have a tapered design such that a width of the metallic fingers 110b (labeled "Finger width") is greatest at the junction with the bus connectors 110a (i.e., at its base) and tapers quadratically along the length of the fingers towards the center of the solar cell giving the fingers a parabolic shape (with generally u-shaped sides). See FIG. 1. Advantageously, this finger design matches the ohmic loss in $I^2R$ most accurately in the following way: while I increases linearly along the length of the finger, $I^2$ increases quadratically with the length of finger; with a parabolic shape of the finger, the resistance R of the finger decreases quadratically with the length of the finger, and the product $I^2R$ stays constant along the length of the finger, which is an optimal situation. The wider section of the metallic fingers 110b near the edges of the solar cell allow for the larger amount of cumulative current to be conducted to the bus connectors 110a, away from the solar cell, while at the same time minimizing the shadowing effect by tapering the width of the metallic fingers 110b such that a smaller area of the solar cell surface is blocked by the top contact 110 at the center of the solar cell. By way of example only, the width of the metallic finger at its base (its greatest width) may be from about 20 micrometers (μm) to about 200 μm, and ranges therebetween, and the width of the metallic finger at the end opposite its base (its smallest width) may be from about 2 μm to about 20 μm, and ranges therebetween.

According to an exemplary embodiment, an even spacing (labeled "Finger spacing") is employed between the metallic fingers 110b to produce a regular grid pattern on the top of the solar cell. The finger spacing is measured, for example, as the distance from the side of one of the metallic fingers 110b to an adjacent side of the adjacent metallic fingers 110b in the grid. See FIG. 1.

It is notable that it is not necessary for the metallic fingers 110b to each taper to a point at the center of the solar cell as shown. For instance, a less aggressive taper may be employed and the metallic fingers 110b may come to a blunt tip at the center of the solar cell (not shown), so long as a tapered design is employed wherein a width of the metallic fingers 110b is greater at the bus connectors than at the center of the solar cell. Further, in the embodiment shown in FIG. 1 the metallic fingers 110b on opposite sides of the solar cell contact one another in the middle of the solar cell. Examples are however provided herein where contact between the individual metallic fingers is not present (i.e., the fingers are in a non-contact position with one another in the center of the solar cell). See, for example, FIG. 10 described below. Namely, the tip of the parabolic-shaped metallic fingers may not touch. Thus a gap between the tips of the metallic fingers can exist. The length of the gap is preferably commensurate to the finger spacing.

In the exemplary embodiment depicted in FIG. 1, the metallic fingers 110b have a uniform height (labeled "Finger height") across the top surface of the solar cell. This is however not a requirement, and an example is provided in FIG. 3 (described below) wherein both the width and the height of the metallic fingers are tapered along the length of the fingers towards the center of the solar cell.

FIG. 2 is a diagram illustrating the top contact 110 from a top view (i.e., from viewpoint A—see FIG. 1). FIG. 2 illustrates the tapered design of the metallic fingers 110b giving them a parabolic shape. Namely, the finger width tapers quadratically from the bus connectors 110a on the sides of the solar cell to a smallest width at the center of the solar cell. It is notable that the present top contact designs are shown throughout in solid white when depicted in three-dimensions and in solid black when depicted in top view. This is being done merely to provide the best level of clarity for the grid design in the particular representation being shown. This does not imply, for instance, that the top contact 110 depicted in FIG. 1 and FIG. 2 are different. Like structures are numbered alike herein.

Figure 3:
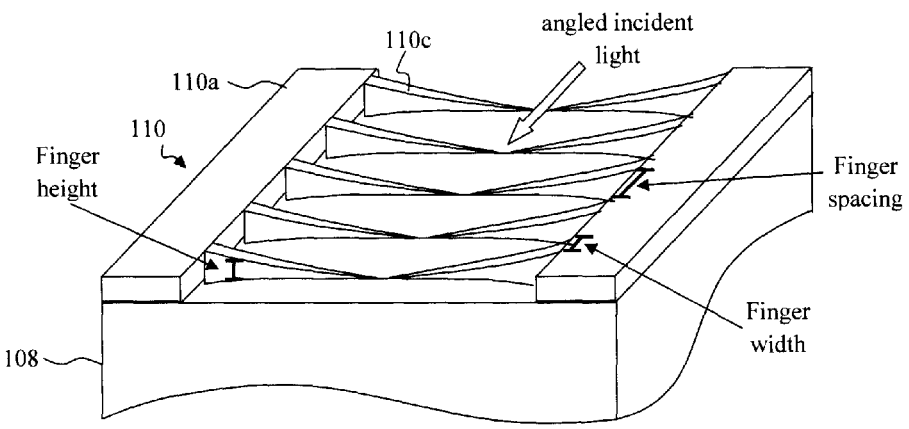
FIG. 3 is a three-dimensional diagram illustrating an exemplary variant of the top contact design of FIG. 1 and FIG. 2 in which a height of the parabolic-shaped metallic fingers is also tapered according to an embodiment of the present invention.

As provided above, the finger height does not have to be uniform across the surface of the solar cell. In that regard, a possible variation in the tapered finger design is shown illustrated in FIG. 3. FIG. 3 is a diagram illustrating the present top contact from an angled top view (i.e., from viewpoint B—see FIG. 1). In this example, the metallic fingers (labeled here as metallic fingers 110c so as to distinguish them from the configurations described above)

taper linearly in both width and height along the length of the fingers moving towards the center of the solar cell (a linear taper in width and thickness is equivalent to a quadratic taper in width only). Namely, as shown in FIG. 3, the metallic fingers 110c have their greatest width and height at the junction with the bus connectors 110a. Both the width and the height of the metallic fingers 110c taper moving towards the center of the solar cell. As described above, an advantage of tapering the width of the metallic fingers is that it maximizes the conductance of cumulative current to the bus connectors 110a and away from the cell, while at the same time minimizing the area of the solar cell surface blocked by the top contact. By also tapering the height of the metallic fingers one can also minimize the blocking of light incident at an angle to the surface of the solar cell. See FIG. 3. By way of example only, the height of the metallic finger at its base (its greatest height) may be from about 5 μm to about 100 μm, and ranges therebetween, and the height of the metallic finger at the end opposite its base (its smallest height) may be from about 0.1 μm to about 10 μm, and ranges therebetween.

Figure 4:
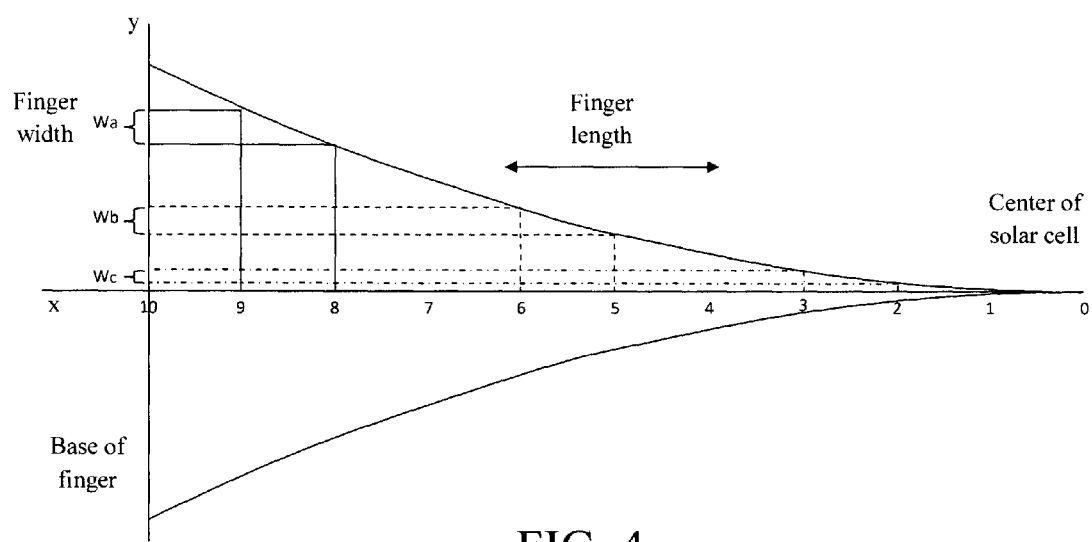
FIG. 4 is a schematic diagram illustrating a width of the metallic finger tapering quadratically along its length giving the metallic finger a parabolic shape according to an embodiment of the present invention.

The present quadratically tapered width design resulting in parabolic-shaped grid fingers is further illustrated in FIG. 4. As shown in FIG. 4, decreasing the width of the fingers quadratically along its length results in the finger having a parabolic shape. As described above, this parabolic shape represents one optimal design for the grid fingers because the decrease in resistance along the fingers matches the increase in the square of the current, $I^2$, and provides for a minimum overall power loss for a given amount of shadowing by the finger. From FIG. 4 it can be seen that moving along the x-axis from the base of the finger, along its length, towards the center of the solar cell the width of the finger decreases quadratically (i.e., from Wa to Wb to Wc, etc.). Namely, for a parabola, the taper of the fingers is quadratic. FIG. 4 shows that the increase in thickness is not constant over the x-axis, e.g., for three different regions in x of finger length one in this example, the corresponding regions in the y-axis are respectively wc, wb, and wa. The regions in the y-axis keep increasing; the function that describes the parabola is $y=x^2$ (i.e., x square, or x •x). The same would be true in the case for a parabolic-shaped tapered height of the fingers (if present)—see FIG. 3.

The benefit of the tapered metallic fingers in FIGS. 1 and 2 (and the variant in FIG. 3) as compared to the conventional uniform finger design described, for example, in FIG. 1a of Wen is now quantitatively calculated. As described above, the common linear grid design shown in FIG. 1a of Wen includes two parallel bus connectors (also referred to below as a left and right bus) on opposite sides of the cell and thinner metallic fingers (of uniform width, height, etc.) interconnecting the bus connectors in a ladder-like configuration. For these two cases (i.e., the present tapered design versus a common linear grid design as per FIG. 1a of Wen), the amount of optical shadowing is made equal by choosing the width of the tapered fingers at their base (i.e., at the junction with the bus connectors) to be twice the width of the uniform fingers in the common linear grid design shown in FIG. 1a of Wen. $R_0$ is designated herein to be the overall resistance of the uniform grid fingers from the left bus to the right bus on the common linear grid design shown in FIG. 1a of Wen. $R_0$ is readily measurable experimentally, and is generally on the order of 10 milli-Ohms (mΩ) to 1,000 mΩ for a 5 millimeter (mm)×5 mm solar cell. For the uniform fingers of the common linear grid design shown in FIG. 1a of Wen and for a uniform illumination of the solar cell, a calculation shows that the electrical resistive loss in the grid fingers of the cell is:

$$P_{Loss.UniformFingers} = \frac{R_0 I^2}{12},$$

wherein I is the photocurrent generated by the cell. By comparison, for the present triangular-shaped fingers, the corresponding loss is:

$$P_{Loss.TriangularFingers} = \frac{R_0 I^2}{16},$$

which is 25% lower than the uniform finger design. A similar reduction of $P_{Loss}$ can be computed between the uniform grid fingers in the inverted square symmetry grid configuration shown in FIG. 1b of Wen and the present tapered metallic fingers in the embodiment illustrated in FIG. 6 (described below).

A number of variants of the present top contact design are provided herein. In other embodiments described below, the shape of the fingers is further optimized, either to facilitate manufacturing, or to further reduce $P_{Loss}$, especially in cases where illumination is non-uniform which often occurs in concentrator photovoltaic systems.

In the following description and accompanying figures it is assumed that the top contact is present on top of a solar cell in the same manner as shown, for example, in FIG. 1. Further, the depictions will be that of a top-down view (see FIG. 1 (vantage point A) for the orientation of the top down view in relation to the top contact).

Figure 5:
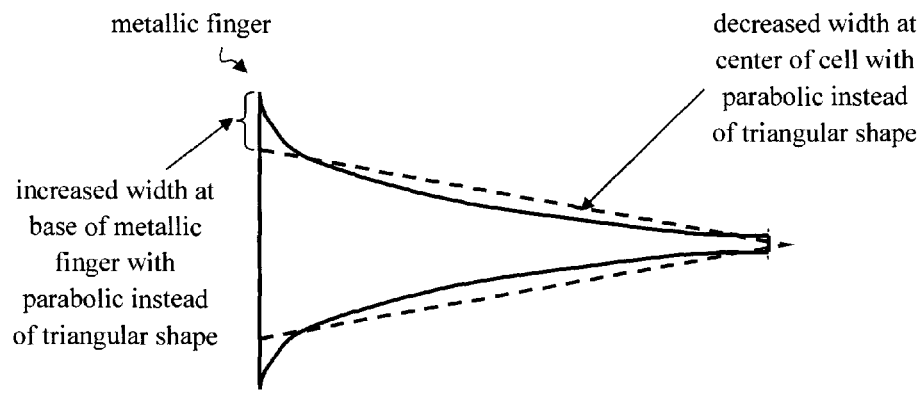
FIG. 5 is a schematic diagram illustrating differences in the area covered by the metallic fingers at the center of the solar cell and the width of the metallic finger at the bus connectors between a parabolic- and a triangular-shaped metallic finger design according to an embodiment of the present invention.

Another tapered finger design contemplated herein is a triangular-shaped finger design. A triangular-shaped design meets the general requirements herein that the width of the finger at its base is greater than the width of the finger at the center of the solar cell. Several tradeoffs are however made when switching from a parabolic to a triangular-shaped finger design. First, as provided above, the ohmic loss is not constant along the finger, but increases near the base of the finger ($I^2$ increases quadratically, but R decreases linearly only, which makes the product $I^2R$ increase as one moves closer to the base of the finger). Thus a parabolic shape is an optimized design. Second, as shown in FIG. 5, through use of a parabolic-shaped metallic finger, optical shading is less near the center of the solar cell and electrical conduction is greater near the edges of the cell. FIG. 5 compares a triangular metallic finger (shown in a dotted line) overlaid on top of a parabolic shaped metallic finger. As this shows, the area covered by the metallic fingers is increased at the center of the solar cell (thereby increasing shadowing), while at the same time the width of the metallic finger is decreased at the bus connectors (thereby decreasing conductance) when going from a parabolic- to a triangular-shaped metallic finger design.

In this or in any other embodiments, the metallic fingers can be disconnected (from one another) near the center of the solar cell. Since the photo-generated current can be directed to either side of the solar cell, the amount of effective current in the center regions of the metallic fingers is very small, and hence, the fingers can be removed entirely over a small central region of the solar cell. By way of example only, the size of this central region of the solar cell (from which the metallic fingers can be removed) is on the order of from about 1 to about 3 times the spacing between the metallic fingers.

Figure 6:
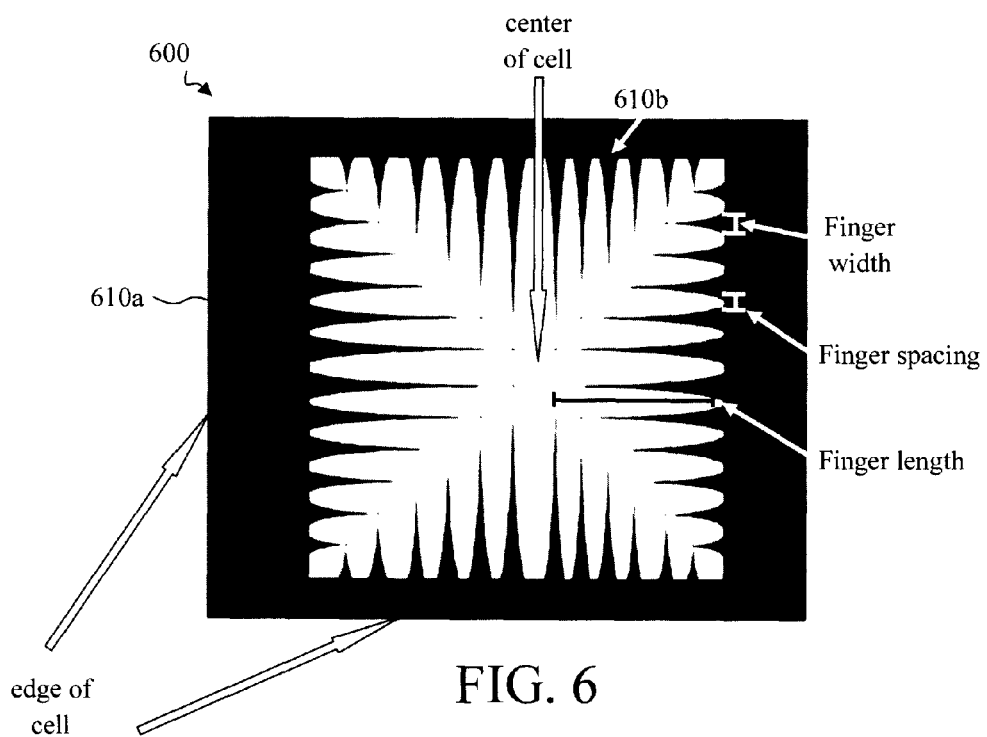
FIG. 6 is a top-down diagram illustrating an alternative design of the present optimized top contact grid having a nested finger design wherein the metallic fingers have a parabolic shape according to an embodiment of the present invention.

Another variant of the present optimized top contact design is shown illustrated in FIG. 6. As with the previous designs in FIGS. 1-3, the top contact 600 in FIG. 6 has bus connectors (i.e., bus connectors 610a) and multiple parabolic-shaped metallic fingers (i.e., metallic fingers 610b). In this example, however, the bus connectors 610a are present on all four edges of the solar cell (see FIG. 6). This bus configuration permits the bus connectors 610a to be directly connected to one another (contrast with the design shown in FIGS. 1-3 where the bus connectors are on opposite sides of the cell and connected only by the metallic fingers). As described above, the parabolic design of the metallic fingers 610b is such that a width of the metallic fingers 610b is greatest at the junction with the bus connector and tapers quadratically toward the center of the solar cell (i.e., the metallic fingers 610b have a tapered design wherein the width of the fingers tapers quadratically along the length of the fingers, giving the fingers a parabolic shape). In this case however, the metallic fingers 610b have varying lengths (labeled "Finger length"). Namely, the metallic fingers 610b having a longest length are present at the center of the solar cell, and the lengths of the metallic fingers 610b taper gradually moving toward the edges of the solar cell. This tapered-length metallic fingers design accommodates the configuration as shown in FIG. 6 where the metallic fingers 610b extend out from the bus connectors 610a on all four edges of the solar cell toward the center of the solar cell. As shown in FIG. 6, in this nested parabolic-shaped metallic finger design, the metallic fingers 610b interconnect the bus connectors on perpendicular edges of the solar cell. It is notable however that top contact grid designs are provided herein where the metallic fingers do not make contact with one another.

For illustrative purposes only, the following non-limiting definitions are provided to help understand the present teachings. In the above description, reference is made to the length, width, and height of the metallic fingers. By way of example only, in the exemplary embodiments depicted in the figures the length of a metallic finger is often the longest dimension of the metallic finger. The width of a metallic finger is, in top-down view, a dimension of the metallic finger perpendicular to its length. As provided above, the width of the metallic fingers can be varied to give the fingers a tapered design. The height of a metallic finger is, in side view, a dimension of the metallic finger perpendicular to its length. As provided above, the height of the metallic fingers can be uniform, or varied to give the fingers a tapered design. Reference may also be made herein to a 'base' of a metallic finger. The base of the metallic finger is the end of the finger attached to a bus connector or another metallic finger (see, e.g., fractal design, described below). It is at its base that the metallic finger has its greatest width. Also, when the height of the finger is tapered (see above) it is at its base that a finger has its greatest height. Conversely, the end of the finger opposite the base is the point at which the metallic finger has its smallest width (and optionally smallest height).

Figure 7:
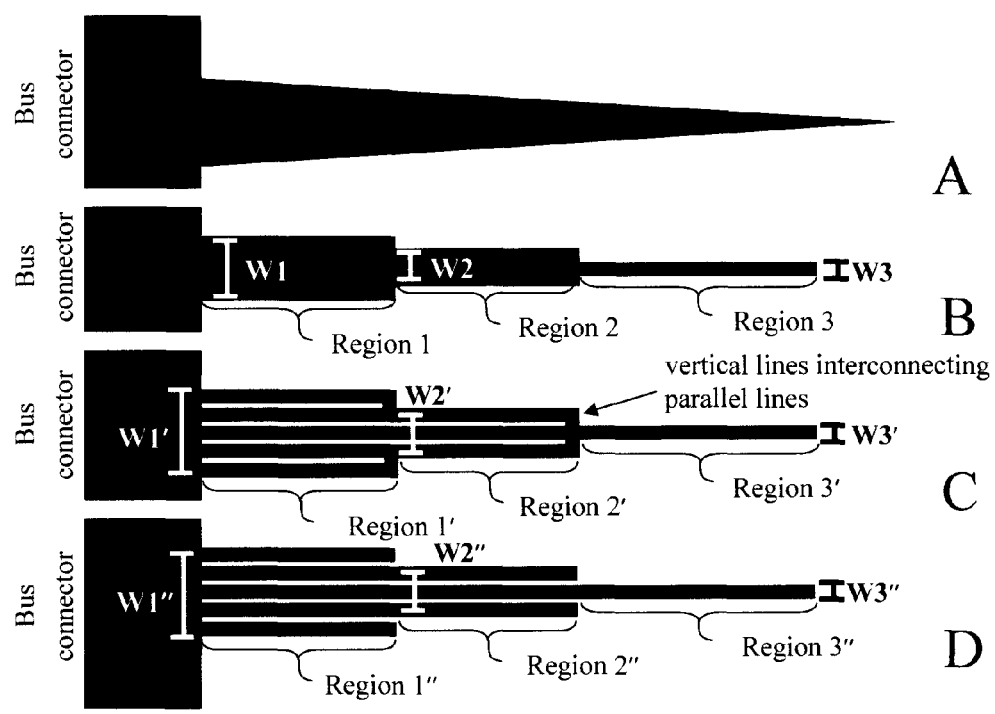
FIG. 7A is a top-down diagram illustrating a triangular-shaped metallic finger design according to an embodiment of the present invention.
FIG. 7B is a top-down diagram illustrating a metallic finger design which includes a line having regions of differing width according to an embodiment of the present invention.
FIG. 7C is a top-down diagram illustrating a metallic finger design which includes multiple parallel lines wherein a number of the parallel lines is varied from region to region which effectively increases/decreases the overall width of the finger from one region to another according to an embodiment of the present invention.
FIG. 7D is a top-down diagram illustrating a variation of the metallic finger design shown in FIG. 7C wherein only horizontal lines are included in the finger design according to an embodiment of the present invention.

As provided above, other possible variants of the metallic finger design which adhere to the same general tapered configuration are contemplated herein. See, for example, FIGS. 7A-D. A triangular shaped metallic finger is shown in FIG. 7A. With a triangular-shaped metallic finger, the width of the finger at its base is greater than the width of the finger at the center of the solar cell. As opposed to the parabolic finger design, with triangular-shaped fingers the width of the fingers tapers gradually (rather than quadratically) along the length of the finger. The finger shapes depicted in FIGS. 7B-D all approximate the uniform width variation of the triangular metallic finger in FIG. 7A. Any of these alternative metallic finger designs in FIG. 7A-D may be employed in any of the previously described top contact grid designs in place of the parabolic fingers. One potential advantage to the metallic finger designs shown in FIGS. 7B-D is for ease of manufacturing processes, where metallization technologies generally favor the fabrication of horizontal or vertical line edges, and in some cases, the fabrication of lines of uniform width. It is further noted that any of the grid/finger designs provided herein may be used in combination with one another and/or in combination with any other suitable grid/finger designs. By way of example only, the present grid design might include a combination of triangular-shaped and parabolic-shaped metallic fingers (see, for example, FIG. 11, below). Alternatively, any one of the finger designs in FIGS. 7B-D may be used in combination with triangular-shaped and/or parabolic-shaped metallic fingers in the same grid.

Thus, for example, in FIG. 7B, a metallic finger design is shown which includes a line having regions of differing width. For instance, in the example shown, the metallic finger has three separate regions and thus three different widths. As shown in FIG. 7B, there is a uniform thickness in each of the regions (e.g., the metallic finger has a first uniform width W1 within a Region 1 thereof, the metallic finger has a second uniform width W2 within a Region 1 thereof, etc.). The region of the metallic finger having greatest width (in this example Region 1—W1) is present at the junction with the bus connector. The region of the metallic finger having the next greatest width (in this example Region 2—W2) is present on a side of the region with the greatest width opposite the bus, and so on, ending with the region of the metallic finger having the smallest width (in this example Region 3—W3) being present at the center of the solar cell. In the example depicted, W1>W2>W3. By contrast with the gradual tapered designs (e.g., triangular shaped, parabolic-shaped, etc.) the segmented finger design in FIG. 7B is composed of only horizontal and vertical line edges which, as provided above, can be advantageous from a manufacturing perspective. By way of example only, W1 may be from about 20 μm to about 200 μm, and ranges therebetween, W2 may be from about 10 μm to about 100 μm, and ranges therebetween, and W3 may be from about 5 μm to about 50 μm, and ranges therebetween.

FIG. 7C employs a similar concept of having multiple regions in a metallic finger, wherein a number of lines is varied from region to region (which effectively increases/decreases the overall width of the finger from one region to another). For instance, as shown in FIG. 7C, each region of the metallic finger (i.e., Region 1', Region 2', etc.) contains one or more parallel lines. The number of lines is uniform within a given region (e.g., the metallic finger has five parallel lines within a Region 1' thereof, the metallic finger has three parallel lines within a Region 2' thereof, etc.). In the exemplary embodiment shown in FIG. 7C, the region having the most number of parallel lines (e.g., Region 1'—with five parallel lines) is present at the junction of the metallic finger and the bus connector. The region having the next highest number of parallel lines (e.g., Region 2'—with three parallel lines) is present on a side of the region having the most number of parallel lines opposite the bus, and so on, ending with the region of the metallic finger having the fewest number of parallel lines (e.g., Region 3'—with one single line) being present at the center of the solar cell.

As a result, the overall width of the metallic finger is decreased moving from the bus connector toward the center of the solar cell. Namely, as depicted in FIG. 7C, in this example, Region 1' has a width W1', Region 2' has a width W2', and Region 3' has a width W3', wherein W1'>W2'>W3'. By way of example only, W1' may be from about 20 µm to about 200 µm, and ranges therebetween, W2' may be from about 10 µm to about 100 µm, and ranges therebetween, and W3' may be from about 5 µm to about 50 µm, and ranges therebetween.

In the metallic finger configuration shown in FIG. 7C, there are vertical lines interconnecting the parallel lines. From a manufacturing perspective, while creating a pattern containing both vertical and horizontal lines is possible, a further optimization for ease of manufacture would be to include only horizontal lines in the design. Thus in a variant of FIG. 7C, the vertical lines can be eliminated from the design. See for example, FIG. 7D.

Similar to FIG. 7C, with the metallic finger design shown in FIG. 7D a number of lines is varied from region to region (which effectively increases/decreases the overall width of the finger from one region to another). For instance, as shown in FIG. 7D, each region of the metallic finger (i.e., Region 1", Region 2", etc.) contains one or more parallel lines. The number of lines is uniform within a given region (e.g., the metallic finger has five parallel lines within a Region 1" thereof, the metallic finger has three parallel lines within a Region 2" thereof, etc.). In the exemplary embodiment shown in FIG. 7D, the region having the most number of parallel lines (e.g., Region 1"—with five parallel lines) is present at the junction of the metallic finger and the bus connector. The region having the next highest number of parallel lines (e.g., Region 2"—with three parallel lines) is present on a side of the region having the most number of parallel lines opposite the bus, and so on, ending with the region of the metallic finger having the fewest number of parallel lines (e.g., Region 3"—with one single line) being present at the center of the solar cell.

As a result, the overall width of the metallic finger is decreased moving from the bus connector toward the center of the solar cell. Namely, as depicted in FIG. 7D, in this example, Region 1" has a width W1", Region 2" has a width W2", and Region 3" has a width W3", wherein W1">W2">W3". By way of example only, W1" may be from about 20 µm to about 200 vim, and ranges therebetween, W2" may be from about 10 µm to about 100 µm, and ranges therebetween, and W3" may be from about 5 µm to about 50 µm, and ranges therebetween.

Figure 8:
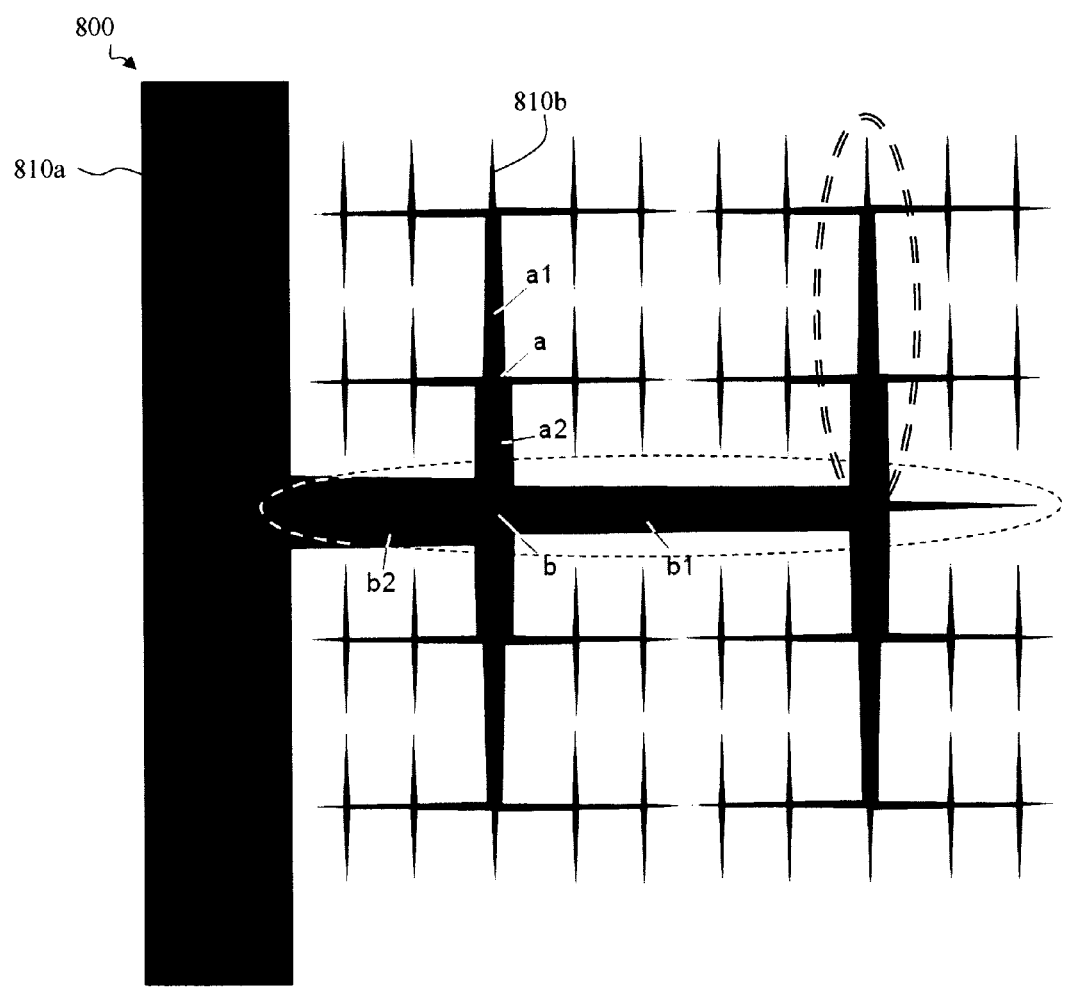
FIG. 8 is a top-down diagram illustrating an alternative design of the present optimized top contact grid having the metallic fingers arranged in a fractal design according to an embodiment of the present invention.

Yet another variant of the present top contact grid design is shown in FIG. 8. As with the previous designs, the top contact 800 in FIG. 8 has multiple metallic fingers (i.e., metallic fingers 810b joined to a bus connector (i.e., bus connector 810a). In accordance with the present techniques, each of the metallic fingers 810b has a tapered (triangular-shaped) design. Further in this particular example, the metallic fingers 810b are arranged in a fractal design. A fractal design includes a repeating pattern that is present at every scale. For instance, in the present fractal finger design the pattern replicates itself two (or more) times at a different scale—which gives it the fractal property.

Specifically, as shown in FIG. 8, the pattern includes a metallic finger 810b (encircled with a single dotted line) having a tapered (triangular) design and joined at its base to the bus connector 810a. That metallic finger has four branches (one of which is encircled with a double dotted line). Each branch includes a tapered metallic finger 810b with four branches. Thus, the pattern repeats itself, hence the fractal property. Further, the dimensions of the metal fingers 810b (e.g., length, width, etc.) get progressively smaller as the pattern is repeated at each branch. This again is a property of a fractal, see above. The metallic fingers in the fractal design example shown in FIG. 8 each have a triangular shape. The fractal design may also be implemented where one or more of the metallic fingers have a parabolic shape. See, for example, FIG. 11—described below.

Some notable characteristics of the present fractal grid design are as follows: first, the pattern covers a wide portion (or most) of the solar cell surface (i.e., like a regular grid, a fractal pattern can be made to cover the entire surface of the solar cell without leaving big gaps); second, as described above, the pattern replicates itself two (or more) times at a different scale—this gives it the fractal property; third, the pattern is very thin, except in the branches where current accumulates. At each intersection (e.g., a or b in FIG. 8), the width of the main branch (e.g., a1 or b1) increases after the intersection (e.g., to a2 or b2 respectively), to account for the current increase from the side branches. This fractal design provides an additional way to optimize the size of each member of the grid as a function of the electrical current that it carries, and to thereby minimize the overall electrical loss while also minimizing the overall shadowing effect.

The present fractal design has notable advantages over a traditional grid design. For instance, charges must travel from the solar cell semiconductor to the nearest finger of the top grid. They must travel through a transparent and poorly conducting film at the top of the semiconductor, typically an Indium Tin Oxide (ITO) film. The fractal shape opens the way to shorten the distance that charges have to travel through the ITO film, because the thinnest branches can be made to cover the area more densely than the traditional grid.

Figure 11:
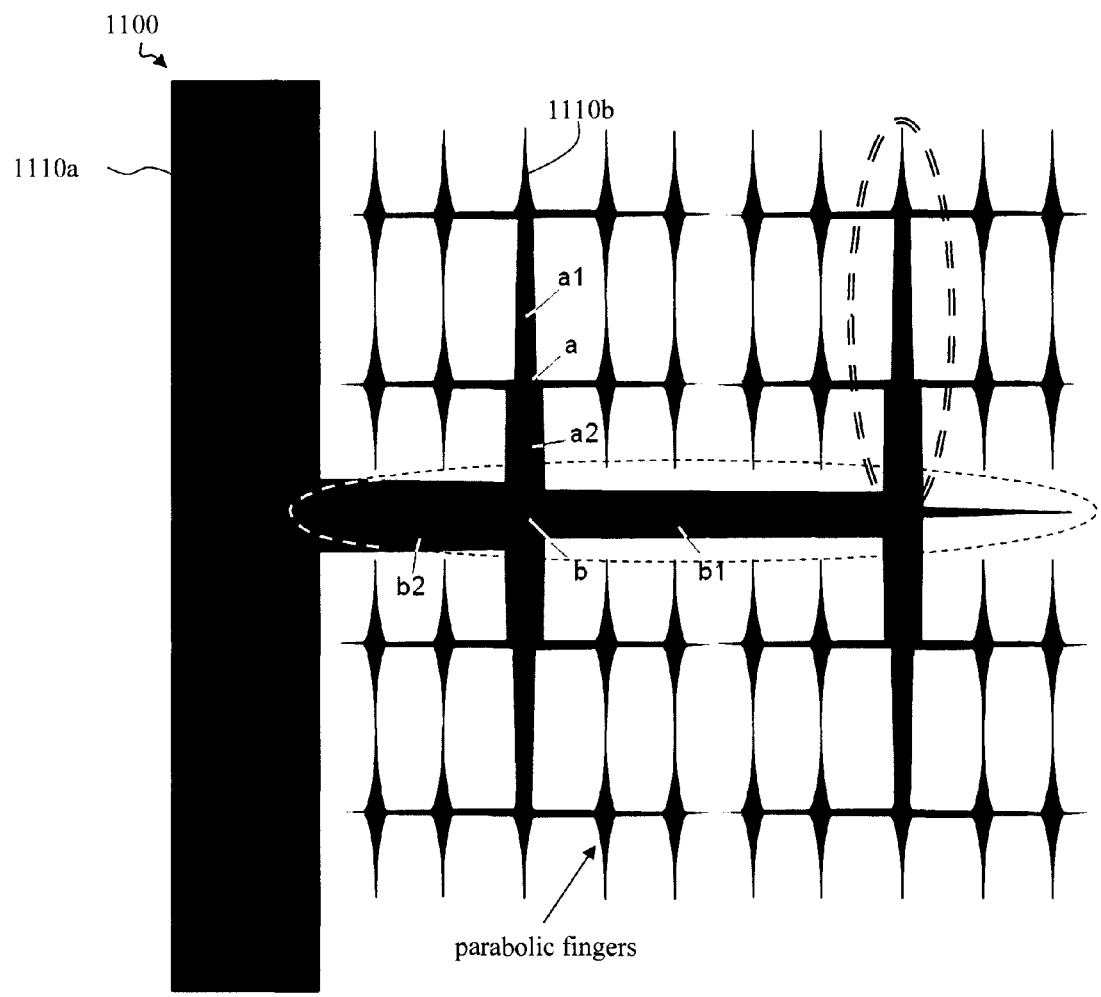
FIG. 11 is a top-down diagram illustrating an alternative design of the present optimized top contact grid having the metallic fingers arranged in a fractal design wherein one or more of the fingers have a parabolic shape according to an embodiment of the present invention.

It is notable that, according to the present techniques, the metallic fingers are attached to one of the bus connectors either directly or indirectly via one or more other of the metallic fingers. For instance, in the grid designs described in conjunction with the description of FIGS. 1-7 above, the metallic fingers (at their base) are attached directly to one of the bus connectors. By comparison, in the fractal pattern example shown in FIG. 8 and FIG. 11 some of the metallic fingers are attached to the bus connectors (indirectly) via other metallic fingers, i.e., the metallic fingers are attached to one another and link back to the bus connectors. Other metallic fingers in the fractal design in FIG. 8 and FIG. 11 are attached directly to the bus connectors. Thus with the present grid designs, the metallic fingers are joined at their base to either a bus connector or another metallic finger.

A number of different techniques may be employed to form the present top contacts on the surface of a solar cell. As provided above, any number of known solar cell configurations may be used in accordance with the present techniques. Thus, it is assumed that the solar cell (upon which the present top contact is formed) is produced using techniques known to those of skill in the art, and therefore the fabrication of the solar cell itself is not described in further detail herein.

Figure 9:
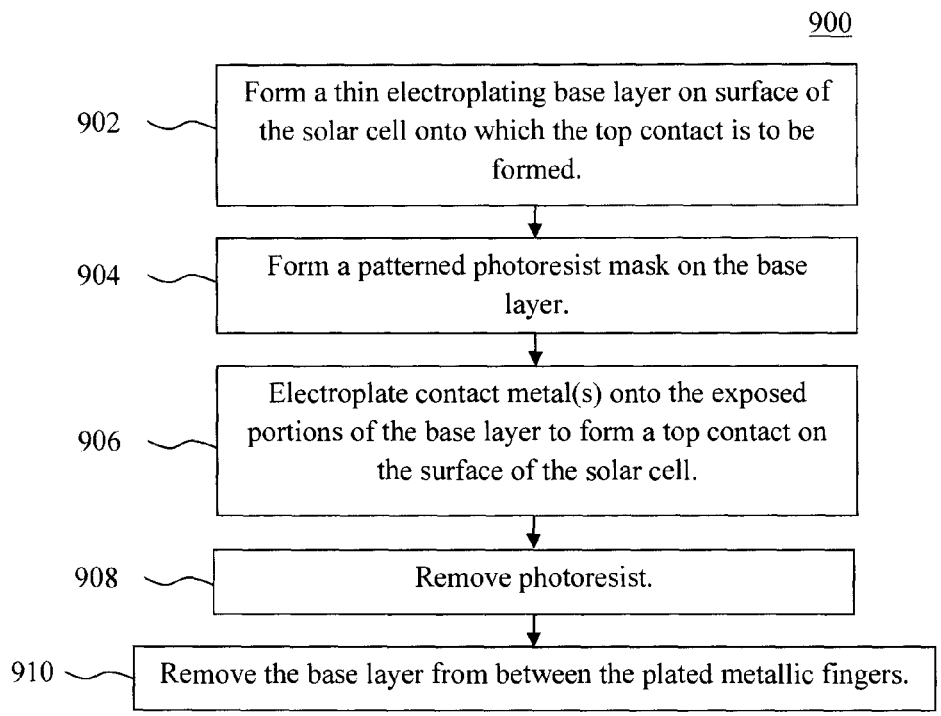
FIG. 9 is a diagram illustrating an exemplary methodology for forming the present top contact on a surface of a solar cell according to an embodiment of the present invention.

FIG. 9 provides an exemplary methodology 900 for forming the present top contact on a surface of a solar cell in accordance with one exemplary embodiment of the present techniques. The process generally begins with the deposition of a metal or metals onto the surface of the solar cell. Suitable metals for forming the top contact include, but are not limited to, nickel (Ni), copper (Cu), platinum (Pt), titanium (Ti), silver (Ag) and combinations including at least one of the foregoing metals. These contact metals can be deposited using processes such as evaporation, sputtering, electroplating, etc.

According to an exemplary embodiment, the metal deposition is performed using an electroplating process performed in an electrolyte (plating bath). According to this example, in step 902, a thin electroplating base layer is first formed on the surface of the solar cell onto which the top contact is to be formed. Referring briefly back to FIG. 1, the top contact is formed on a top-most layer of the solar cell (which in the example in FIG. 1 is the top-most solar cell 108). According to an exemplary embodiment, the base layer is formed on a surface of the solar cell using evaporation or sputtering to a thickness of 20 nanometers (nm) to about 50 nm, and ranges therebetween. The base layer may be formed from any one (or combination) of the above-provided metals (i.e., Ni, Cu, Pt, Ti and/or Ag). The base layer serves as an electrode for the electroplating process.

In step 904, standard lithography and etching techniques are then used to form a patterned photoresist mask on the base layer. The photoresist mask is patterned with one of the present top contact grid designs. Namely, the pattern formed in the photoresist will contain the design for the bus connectors and the fingers in one of the present top contact designs. The patterned photoresist will act as an electroplating mask. By way of example only, plating of metal will only occur on the surface of the solar cell not covered by the patterned photoresist mask.

In step 906, electroplating in an electrolyte is then used to plate the contact metal(s) onto the exposed portions of the base layer to form the present top contact on the surface of the solar cell. It is notable that, as provided above, it may be desirable to vary the height of the metallic fingers (as well as the width) such that the greatest height is present at the base of the fingers. See, for example, FIG. 3, described above. An electroplating process is well suited for this purpose. Namely, as is known in the art, Faradays laws of electrolysis govern the rate of metal deposition during an electroplating process. One particular feature of interest in accordance with the present techniques is that the rate of metal deposition (and thus thickness) is a function of the width of the base layer, wherein a thicker layer can generally be obtained for a wider base layer. Thus, for a given electroplating process performed for a given duration, a greater amount of metal will be deposited where the width of the metallic finger is greater (e.g., at its base) than where the width of the metallic finger is smaller (e.g., at an end opposite the base). The amount/thickness of metal deposited dictates the height of the metallic fingers. See, for example, FIG. 3. Thus, the result is the fingers having a variable height that is greatest at the base of the finger and smallest at the end of the finger opposite the base. Further, when the width of the finger tapers quadratically or gradually (e.g., such as in the case of a parabolic-shaped or triangular-shaped finger), then the height/thickness of the electroplated metal will also have a quadratic or gradual taper.

In step 908, the photoresist can be removed. Techniques for photoresist processing are well known to those skilled in the art, and thus are not described further herein. Finally, in step 910, the base layer is removed from between the plated metallic fingers. By way of example only, the base layer can be removed from between the metallic fingers using a selective wet etching process. Alternatively, a non-selective wet or dry etch can be used. A non-selective etch will etch both the base layer and the metallic fingers. However, based on the thickness difference between the thin base layer and the relatively thicker fingers (exemplary thickness values were provided above), only a minimal amount of etching of the metallic fingers will occur during complete removal of the base layer.

Figure 10:
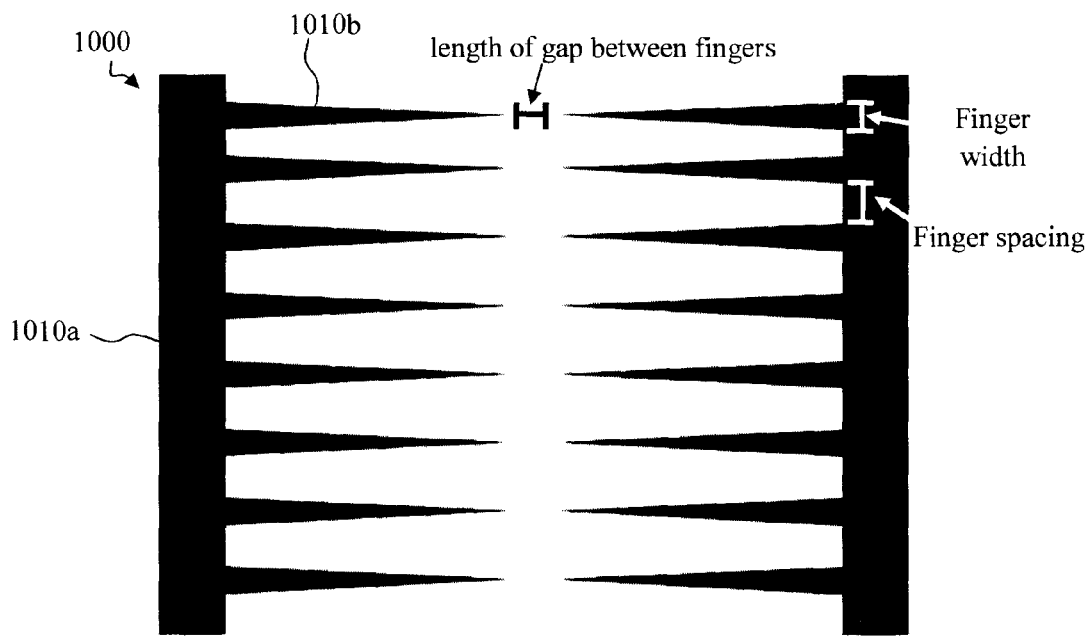
FIG. 10 is a top-down diagram illustrating an alternative design of the present optimized top contact grid wherein the metallic fingers do not meet at the center of the solar cell according to an embodiment of the present invention.

As provided above, embodiments are contemplated herein wherein contact between the individual metallic fingers is not present (i.e., the fingers are in a non-contact position with one another in the center of the solar cell) such that there is a gap between the tips of the metallic fingers. An example of the present top contact grid design wherein the metallic fingers do not contact one another at the center of the solar cell is shown illustrated in FIG. 10. The depiction of triangular-shaped metallic fingers and two parallel bus connectors in FIG. 10 is merely an example. Any of the configurations provided herein can be fabricated having metallic fingers which do not contact one another at the center of the solar cell.

As shown in FIG. 10, the top contact 1000 has two bus connectors (i.e., bus connectors 1010*a*) present on opposite edges of the solar cell and multiple metallic fingers (i.e., metallic fingers 1010*b*) interconnecting the bus connectors. The metallic fingers 1010*b* are attached at their base to the bus connectors 1010*a*. However, by comparison with the embodiments provided above, the tips of the metallic fingers 1010*b* do not meet at the center of the solar cell. Namely, there is a gap present between the fingers. As provided above, since the photo-generated current can be directed to either side of the solar cell, the amount of effective current in the center regions of the metallic fingers is very small, and hence, the fingers can be removed entirely over a small central region of the solar cell. By way of example only, the length of the gap is on the order of from about 1 to about 3 times the spacing between the metallic fingers (the finger spacing).

As provided above, the present grid designs also include a fractal pattern where one or more of the metallic fingers have a parabolic shape. See FIG. 11. As with the previous designs, the top contact 1100 in FIG. 11 has multiple metallic fingers (i.e., metallic fingers 1110*b* joined to a bus connector (i.e., bus connector 1110*a*). In accordance with the present techniques, each of the metallic fingers 1110*b* has a tapered (in this case parabolic) design. The metallic fingers 1110*b* are arranged in a fractal design (i.e., which includes a repeating pattern that is present at every scale and replicates itself two (or more) times at a different scale—which gives it the fractal property).

Specifically, as shown in FIG. 11, the pattern includes a metallic finger 1110*b* (encircled with a single dotted line) having a tapered design and joined at its base to the bus connector 1110*a*. That metallic finger has four branches (one of which is encircled with a double dotted line). Each branch includes a tapered metallic finger 1110*b* with four branches. Thus, the pattern repeats itself, hence the fractal property. Further, the dimensions of the metal fingers 1110*b* (e.g., length, width, etc.) get progressively smaller as the pattern is repeated at each branch. This again is a property of a fractal, see above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A top contact for a solar cell, comprising:
    bus connectors; and metallic fingers attached to the bus connectors, wherein each of the metallic fingers has a base at a first end thereof which is connected to one of the bus connectors or to another one of the metallic fingers such that each of the metallic fingers is attached to one of the bus connectors either directly or indirectly via another one of the metallic fingers and ii) a second end opposite the base, wherein at least one of the metallic fingers has a width and a height that are both tapered quadratically along a length of the metallic finger, and wherein the second end of at least one of the metallic fingers is, at a center of the solar cell, in a non-physical-contact position with the bus connectors and any other of the metallic fingers; wherein the metallic fingers are arranged in a pattern that replicates itself two or more times at a different scale forming a fractal design comprising multiple branches extending out from at least a given one of the metallic fingers whereby the given metallic finger has multiple first branches of the metallic fingers extending out from a side thereof, wherein each of the multiple first branches has multiple second branches of the metallic fingers extending out from a side thereof, and wherein dimensions of the metallic fingers get progressively smaller at each of the multiple branches extending out from the given metallic finger.

2. The top contact of claim 1, wherein at least one of the metallic fingers has a parabolic shape which tapers to a point at the center of the solar cell.

3. The top contact of claim 1, wherein at least one of the metallic fingers has a triangular shape.

4. The top contact of claim 1, wherein for at least one of the metallic fingers a height at the base of the metallic finger is greater than the height at the second end of the metallic finger opposite the base.

5. A solar cell, comprising:
a top contact comprising bus connectors, and metallic fingers attached to the bus connectors, wherein each of the metallic fingers has a base at a first end thereof which is connected to one of the bus connectors or to another one of the metallic fingers such that each of the metallic fingers is attached to one of the bus connectors either directly or indirectly via another one of the metallic fingers and ii) a second end opposite the base, and wherein at least one of the metallic fingers has a width and a height that are both tapered quadratically along a length of the metallic finger, and wherein the second end of at least one of the metallic fingers is, at a center of the solar cell, in a non-physical-contact position with the bus connectors and any other of the metallic fingers;
a bottom contact; and
an optically active material comprising one or more semiconductors disposed between the top contact and the bottom contact.

6. The solar cell of claim 5, wherein at least one of the metallic fingers has a parabolic shape which tapers to a point at the center of the solar cell.

7. The solar cell of claim 5, wherein at least one of the metallic fingers has a triangular shape.

8. The solar cell of claim 5, wherein at least one of the metallic fingers comprises a metallic line having at least a first region at the base of the metallic finger having a uniform width W1 and at least a second region having a uniform width W2, wherein W1>W2.

9. The solar cell of claim 5, wherein at least one of the metallic fingers comprises multiple parallel metallic lines, and wherein a number of the parallel metallic lines varies in different regions of the metallic finger to give the metallic fingers a tapered design such that at least a first region at the base of the metallic finger has a uniform width W1' and at least a second region has a uniform width W2', wherein W1'>W2', and wherein the parallel metallic lines are interconnected by multiple vertical metallic lines at an end of the first region opposite the bus connectors and at an end of the second region opposite the bus connectors, and wherein the vertical metallic lines are perpendicular to the parallel metallic lines.

10. The solar cell of claim 5, wherein for at least one of the metallic fingers a height at the base the metallic finger is greater than the height at the second end of the metallic finger opposite the base.

11. The solar cell of claim 5, wherein the metallic fingers are arranged in a pattern that replicates itself two or more times at a different scale forming a fractal design comprising multiple branches extending out from at least a given one of the metallic fingers whereby the given metallic finger has multiple first branches of the metallic fingers extending out from a side thereof, wherein each of the multiple first branches has multiple second branches of the metallic fingers extending out from a side thereof, and wherein dimensions of the metallic fingers get progressively smaller at each of the multiple branches extending out from the given metallic finger.

12. The solar cell of claim 5, wherein the bus connectors are present on opposing sides of the solar cell, and wherein the metallic fingers extend out from the bus connectors toward the center of the solar cell.

* * * * *